United States Patent
Huang et al.

(10) Patent No.: US 11,302,701 B2
(45) Date of Patent: *Apr. 12, 2022

(54) THREE-DIMENSIONAL STATIC RANDOM ACCESS MEMORY DEVICE STRUCTURES

(71) Applicant: Taiwan Semiconductor Manufacturing Co., Ltd., Hsinchu (TW)

(72) Inventors: Chien-Yu Huang, Zhongli (TW); Chien-Yuan Chen, Hsinchu (TW); Hau-Tai Shieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/000,445

(22) Filed: Aug. 24, 2020

(65) Prior Publication Data

US 2020/0388623 A1    Dec. 10, 2020

Related U.S. Application Data

(63) Continuation of application No. 15/947,330, filed on Apr. 6, 2018, now Pat. No. 10,756,094, which is a (Continued)

(51) Int. Cl.
*G11C 5/02* (2006.01)
*H01L 27/11* (2006.01)
(Continued)

(52) U.S. Cl.
CPC .......... *H01L 27/1104* (2013.01); *G11C 5/025* (2013.01); *G11C 5/063* (2013.01); *G11C 7/18* (2013.01); *G11C 11/417* (2013.01); *G11C 11/418* (2013.01); *G11C 11/419* (2013.01);

*H01L 21/768* (2013.01); *H01L 21/8234* (2013.01); *H01L 23/528* (2013.01)

(58) Field of Classification Search
CPC .......... G11C 11/417–419; G11C 5/025; G11C 5/063
USPC .......................................................... 365/51
See application file for complete search history.

(56) References Cited

U.S. PATENT DOCUMENTS

| 4,398,248 A | 8/1983 | Hsai et al. |
|---|---|---|
| 6,355,501 B1 | 3/2002 | Fung et al. |

(Continued)

*Primary Examiner* — Sung Il Cho
(74) *Attorney, Agent, or Firm* — Slater Matsil, LLP

(57) ABSTRACT

Systems and methods are provided for fabricating a static random access memory (SRAM) cell in a multi-layer semiconductor device structure. An example SRAM device includes a first array of SRAM cells, a second array of SRAM cells, a processing component, and one or more inter-layer connection structures. The first array of SRAM cells are formed in a first device layer of a multi-layer semiconductor device structure. The second array of SRAM cells are formed in a second device layer of the multi-layer semiconductor device structure, the second device layer being formed on the first device layer. The processing component is configured to process one or more input signals and generate one or more access signals. One or more inter-layer connection structures are configured to transmit the one or more access signals to activate the first device layer or the second device layer for allowing access to a target SRAM cell.

20 Claims, 6 Drawing Sheets

Related U.S. Application Data continuation of application No. 15/411,285, filed on Jan. 20, 2017, now Pat. No. 9,941,287, which is a continuation of application No. 14/097,308, filed on Dec. 5, 2013, now Pat. No. 9,558,791.

(51) Int. Cl.

| | |
|---|---|
| *H01L 21/768* | (2006.01) |
| *G11C 5/06* | (2006.01) |
| *G11C 7/18* | (2006.01) |
| *G11C 11/417* | (2006.01) |
| *G11C 11/418* | (2006.01) |
| *G11C 11/419* | (2006.01) |
| *H01L 21/8234* | (2006.01) |
| *H01L 23/528* | (2006.01) |

(56) References Cited

U.S. PATENT DOCUMENTS

| | | | |
|---|---|---|---|
| 6,487,102 B1 | 11/2002 | Halbert et al. | |
| 6,594,169 B2* | 7/2003 | Sakui | G11C 5/025 |
| | | | 365/51 |
| 6,642,555 B1 | 11/2003 | Ishida | |
| 7,123,497 B2 | 10/2006 | Matsui et al. | |
| 7,142,471 B2 | 11/2006 | Fasoli et al. | |
| 7,209,376 B2 | 4/2007 | Saito et al. | |
| 7,221,614 B2* | 5/2007 | Saito | G11C 5/02 |
| | | | 365/230.03 |
| 7,558,096 B2 | 7/2009 | Ikeda | |
| 7,688,621 B2 | 3/2010 | Cho et al. | |
| 7,724,589 B2 | 5/2010 | Rajan et al. | |
| 7,898,893 B2 | 3/2011 | Park et al. | |
| 7,940,578 B2 | 5/2011 | Kang et al. | |
| 7,982,504 B1 | 7/2011 | Robinett | |
| 8,054,663 B2 | 11/2011 | Chung | |
| 8,669,778 B1 | 3/2014 | Or-Bach et al. | |
| 9,432,298 B1 | 8/2016 | Smith | |
| 2004/0100831 A1* | 5/2004 | Knall | G11C 29/50 |
| | | | 365/200 |
| 2006/0233082 A1 | 10/2006 | Lee et al. | |
| 2010/0058127 A1 | 3/2010 | Terao et al. | |
| 2010/0091541 A1* | 4/2010 | Park | G11C 13/0023 |
| | | | 365/51 |
| 2010/0246234 A1* | 9/2010 | Ahn | H01L 24/49 |
| | | | 365/51 |
| 2011/0060888 A1* | 3/2011 | Keeth | G11C 29/808 |
| | | | 711/209 |
| 2011/0103121 A1* | 5/2011 | Osakabe | G11C 7/10 |
| | | | 365/51 |
| 2011/0122676 A1 | 5/2011 | Murooka et al. | |
| 2011/0228582 A1 | 9/2011 | Park et al. | |
| 2011/0305100 A1 | 12/2011 | Yu et al. | |
| 2012/0063208 A1* | 3/2012 | Koyama | G11C 11/407 |
| | | | 365/149 |
| 2013/0148411 A1* | 6/2013 | Atsumi | H01L 27/10897 |
| | | | 365/149 |
| 2014/0269140 A1 | 9/2014 | Sanjeevarao et al. | |
| 2015/0146480 A1 | 5/2015 | Chen et al. | |
| 2015/0255141 A1* | 9/2015 | Koyama | G11C 11/404 |
| | | | 365/51 |

* cited by examiner

THREE-DIMENSIONAL STATIC RANDOM ACCESS MEMORY DEVICE STRUCTURES

PRIORITY CLAIM AND CROSS-REFERENCE

This application is a continuation of U.S. patent application Ser. No. 15/947,330, filed Apr. 6, 2018, now U.S. Pat. No. 10,756,094, issued on Aug. 25, 2020, which is a continuation of U.S. patent application Ser. No. 15/411,285, filed Jan. 20, 2017, now U.S. Pat. No. 9,941,287, issued on Apr. 10, 2018 which is a continuation of U.S. patent application Ser. No. 14/097,308, filed Dec. 5, 2013, now U.S. Pat. No. 9,558,791, issued on Jan. 31, 2017, which are incorporated herein by reference in their entireties.

FIELD

The technology described in this disclosure relates generally to electronic devices and more particularly to memory devices.

BACKGROUND

Static random access memory (SRAM) devices are widely used for electronic applications where high speed, low power consumption and simple operations are needed. A SRAM device often includes a number of memory cells, and each cell may contain multiple transistors.

SUMMARY

In an embodiment, a device includes: a plurality of device layers, each of the device layers including: an SRAM array; a word-line driver connected to the SRAM array; and a layer decoder connected to the word-line driver, the layer decoder configured to activate the word-line driver in response to receiving an access signal; and a global control circuit connected to the layer decoder of each of the device layers, the global control circuit configured to receive an input signal indicating a target SRAM cell of the SRAM array, and to transmit the access signal to activate the layer decoder of a first device layer of the device layers containing the target SRAM cell.

In some embodiments of the device, the word-line driver is configured to activate a first word line associated with the SRAM array of the target SRAM cell in response to being activated by the layer decoder. In some embodiments of the device, each of the device layers further includes: a local input/output circuit connected to the SRAM array and the word-line driver, where the layer decoder is further configured to activate the local input/output circuit in response to receiving the access signal. In some embodiments of the device, the local input/output circuit of each of the device layers is configured to activate one or more first local bit lines associated with the SRAM array of the target SRAM cell in response to being activated by the layer decoder. In some embodiments of the device, the local input/output circuit of each of the device layers is configured to output data read from the target SRAM cell, and to store data to be written to the target SRAM cell. In some embodiments, the device further includes: a global input/output circuit connected to the local input/output circuit of each of the device layers, the global input/output circuit configured to receive data from the local input/output circuit of each of the device layers, and to transmit data to the local input/output circuit of each of the device layers. In some embodiments of the device, the global input/output circuit is formed in a same layer as the global control circuit. In some embodiments of the device, the global input/output circuit is formed in a different layer than the global control circuit. In some embodiments of the device, the global input/output circuit and the global control circuit are each formed in one of the device layers. In some embodiments of the device, the global input/output circuit and the global control circuit are each formed outside of the device layers.

In an embodiment, a device includes: a plurality of device layers including a first device layer, the first device layer including: an SRAM array; a word-line driver connected to the SRAM array; a local input/output circuit connected to the word-line driver and the SRAM array; and a layer decoder connected to the local input/output circuit, the layer decoder configured to activate the word-line driver and the local input/output circuit in response to receiving an access signal; a global control circuit connected to the layer decoder, the global control circuit configured to receive an input signal indicating a target SRAM cell, and to transmit the access signal to activate the layer decoder of the first device layer in response to determining the SRAM array of the first device layer contains the target SRAM cell; and a global input/output circuit connected to the local input/output circuit, the global input/output circuit configured to receive data from the local input/output circuit, and to transmit data to the local input/output circuit.

In some embodiments of the device, the local input/output circuit is configured to activate one or more first local bit lines of the SRAM array associated with the target SRAM cell in response to being activated by the layer decoder. In some embodiments of the device, the word-line driver is configured to activate a first word line of the SRAM array associated with the target SRAM cell in response to being activated by the layer decoder. In some embodiments of the device, the global control circuit is further configured to decode the input signal to produce the access signal. In some embodiments of the device, the global control circuit and the SRAM array are in a same level of a multi-layer structure. In some embodiments of the device, the global control circuit and the SRAM array are in different levels of a multi-layer structure.

In an embodiment, a device includes: a plurality of device layers including a first device layer, the first device layer including: a first SRAM array; a first word-line driver connected to the first SRAM array; a first layer decoder connected to the first word-line driver, the first layer decoder configured to activate the first word-line driver in response to receiving an access signal; a second SRAM array; a second word-line driver connected to the second SRAM array; and a second layer decoder connected to the second word-line driver, the second layer decoder configured to activate the second word-line driver in response to receiving the access signal; and a global control circuit connected to the first layer decoder and the second layer decoder, the global control circuit configured to receive an input signal indicating a target SRAM cell, and to transmit the access signal to activate one of the first layer decoder or the second layer decoder of the first device layer in response to determining the target SRAM cell is in the first SRAM array or the second SRAM array of the first device layer.

In some embodiments of the device, the global control circuit is disposed in the first device layer. In some embodiments of the device, the global control circuit is disposed outside of the first device layer. In some embodiments of the device, the first layer decoder and the second layer decoder are disposed between the first SRAM array and the second SRAM array in a plan view of the device layer.

DETAILED DESCRIPTION

Figure 1:
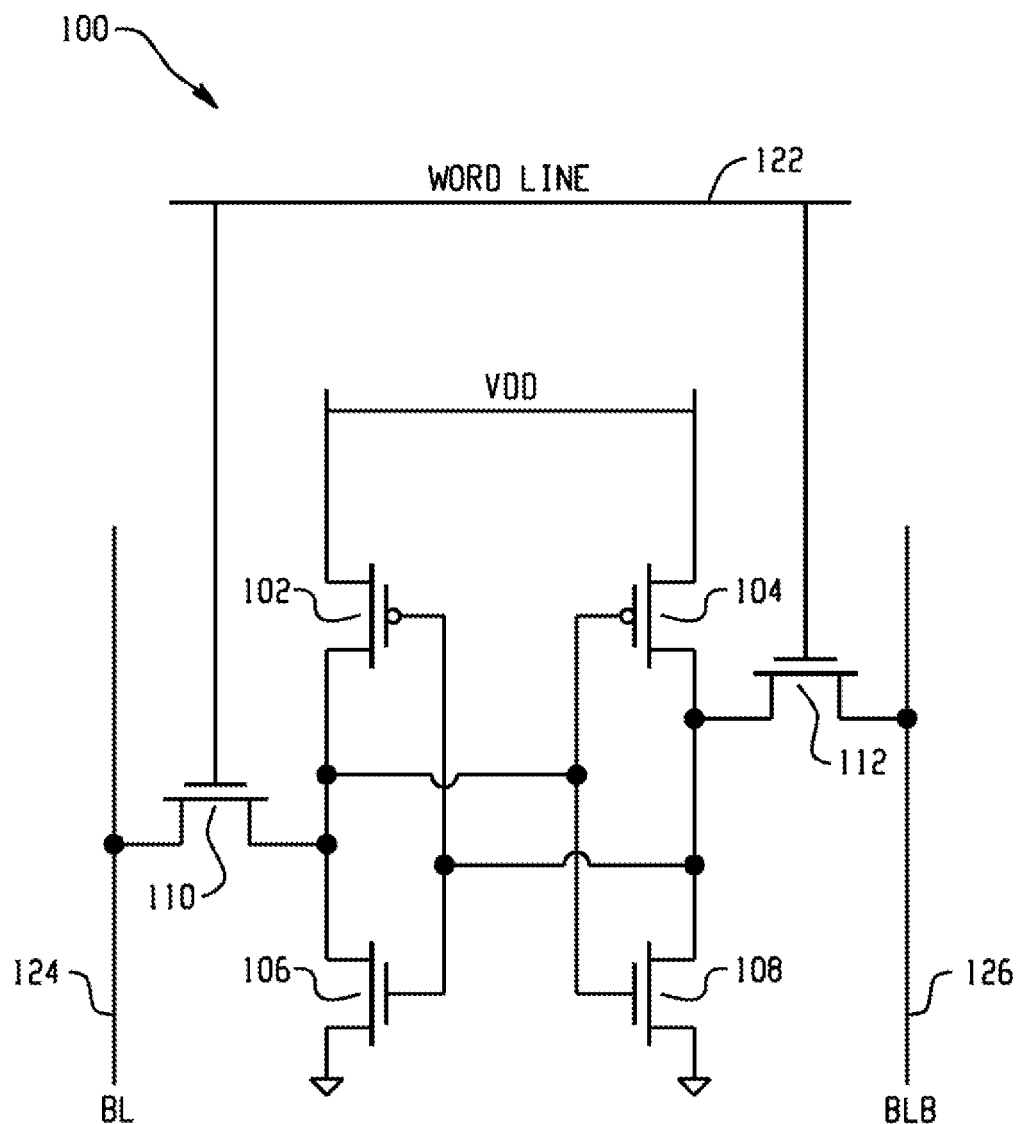
FIG. 1 depicts an example diagram of a six-transistor (6-T) SRAM cell.

FIG. 1 depicts an example diagram of a six-transistor (6-T) SRAM cell. As shown in FIG. 1, the SRAM cell 100 includes two pull-up transistors 102 and 104 (e.g., P-channel transistors), two pull-down transistors 106 and 108 (e.g., N-channel transistors), and two pass-gate transistors 110 and 112 (e.g., N-channel transistors). The transistors 102, 104, 106 and 108 are connected in cross-coupled inverter configuration and form a flip-flop for storing data. The pass-gate transistors 110 and 112 are both coupled to a word line 122 that corresponds to a row in a memory array including the SRAM cell 100. Two complementary bit lines 124 and 126 are coupled to the pass-gate transistors 110 and 112 respectively.

Usually, the SRAM cell 100 operates in a read mode, a write-enable mode, or a power-down mode (i.e., a data-retention mode). In a read mode, the pass-gate transistors 110 and 112 are turned on in response to a word-line signal from the word line 122 to perform a read operation. A data bit stored in the SRAM cell 100 may be read out through the bit lines 124 and 126. In a write-enable mode, a write operation is performed to write a new data bit to the SRAM cell 100 through the bit lines 124 and 126 when a word-line signal from the word line 122 turns on the pass-gate transistors 110 and 112. Furthermore, in the power-down mode, the pass-gate transistors 110 and 112 are turned off, and the data bit is stored in the SRAM cell 100.

Figure 2:
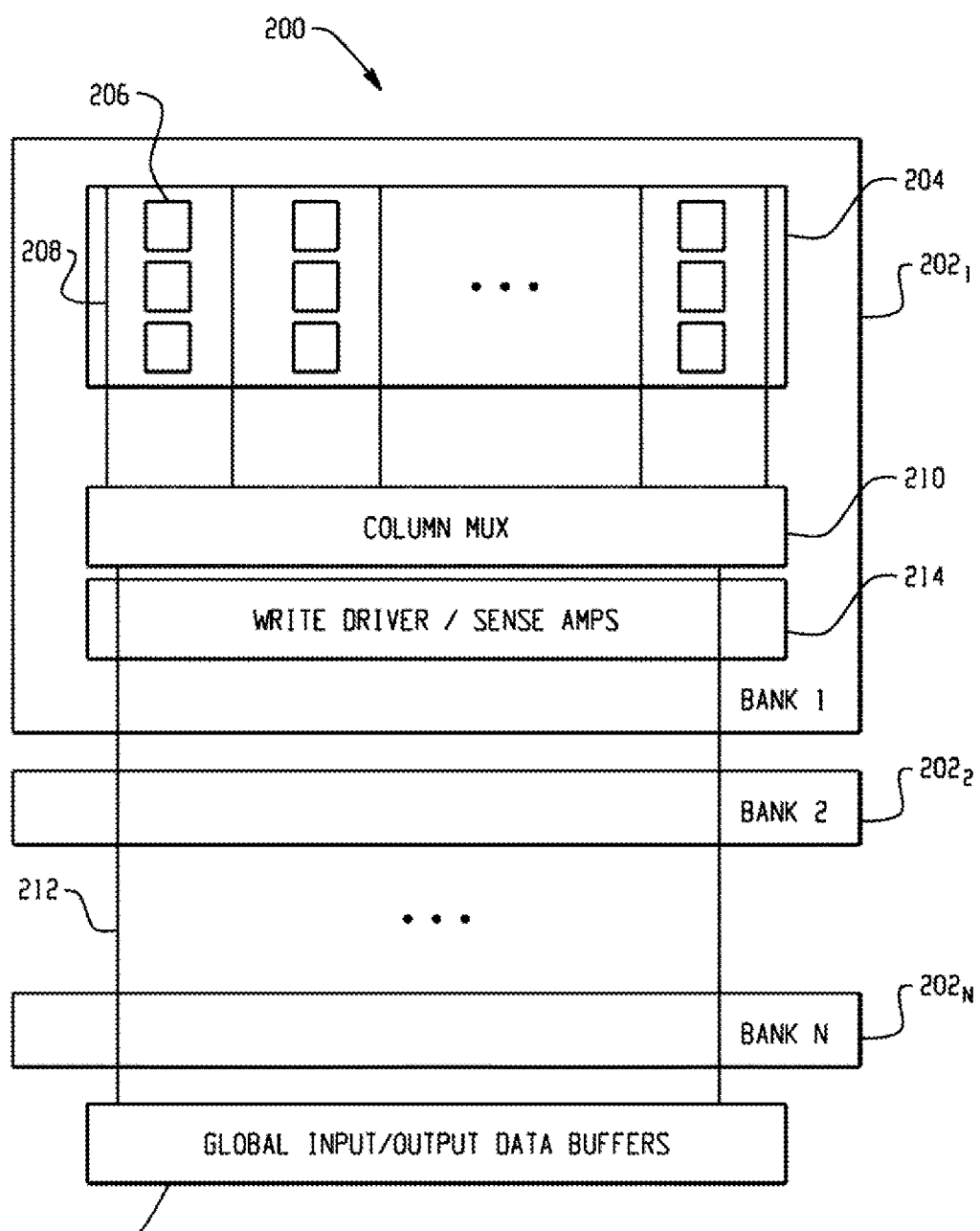
FIG. 2 depicts an example diagram of a SRAM device.

FIG. 2 depicts an example diagram of a SRAM device. As shown in FIG. 2, the SRAM device 200 includes multiple SRAM banks $202_1, 202_2, \ldots, 202_N$, where N is an integer larger than 1. For example, within the SRAM bank $202_1$, a SRAM array 204 contains multiple SRAM cells 206 disposed at intersections of rows and columns of the SRAM array 204. A plurality of local bit lines 208 are arranged along the columns of the SRAM array 204, and a plurality of word lines (not shown in FIG. 2) are arranged along the rows of the SRAM array 204. Through certain selection circuitry, a column multiplexer 210 selects a subset of the local bit lines 208 for access. One or more global bit lines 212 are coupled to the local bit lines 208 through the column multiplexer 210 and write-driver/sense-amps circuits 214. An input/output data buffer 216 provides buffers for reading data out from and/or receiving input data to the SRAM device 200. For example, as shown in FIG. 2, the global bit lines 212 are also used by the SRAM banks $202_2, \ldots, 202_N$. As an example, the SRAM cells 206 include six-transistor SRAM cells (e.g., the SRAM cell 100), eight-transistor SRAM cells, or other types of SRAM cells.

As shown in FIG. 2, the lengths of the local bit lines 208 and the lengths of the global bit lines 212 both affect the speed of the SRAM device 200. One approach to increase the speed of a SRAM device is to shorten the local bit lines 208.

Figure 3:
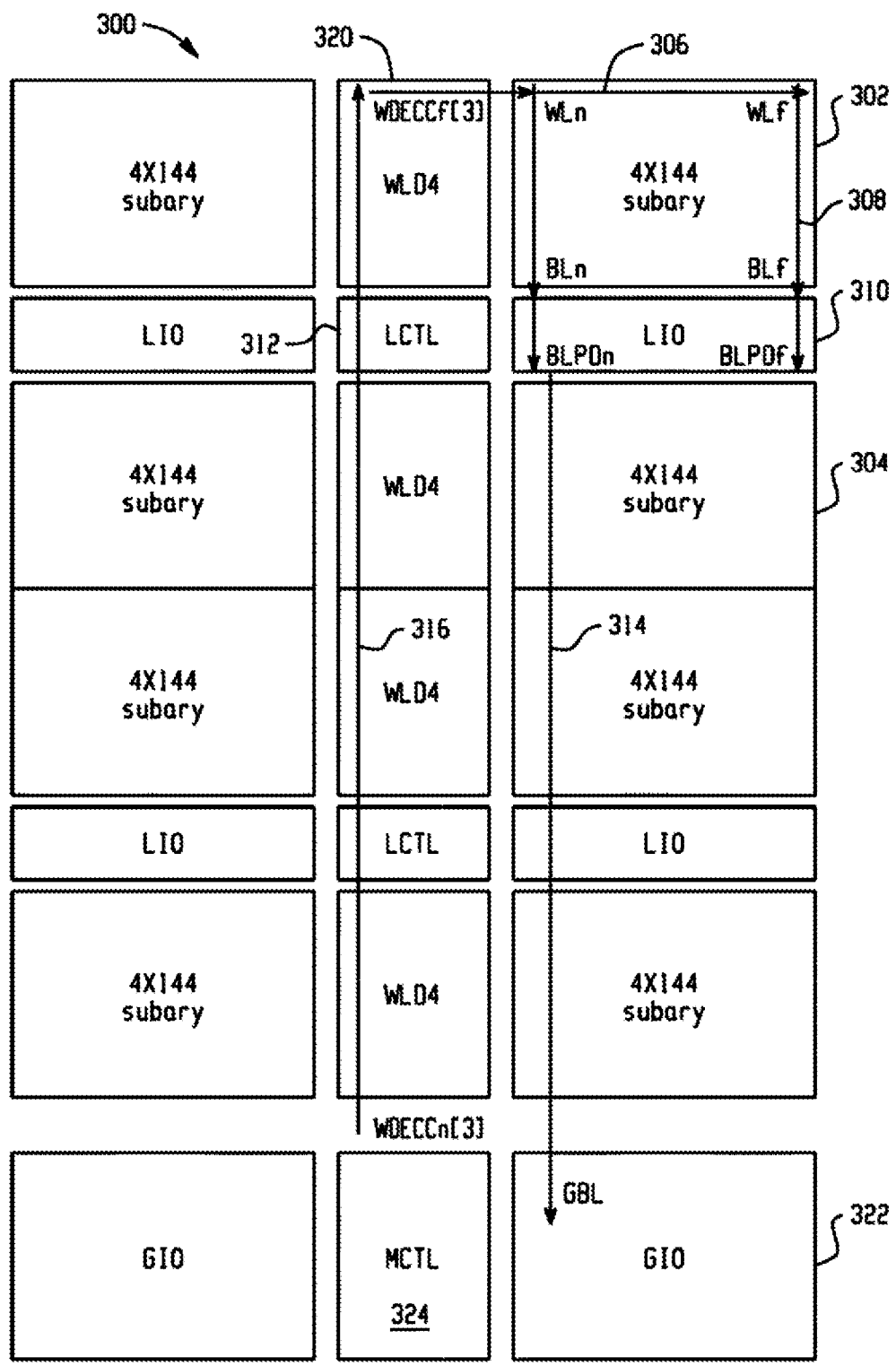
FIG. 3 depicts an example diagram showing a SRAM device with memory sub-arrays.

FIG. 3 depicts an example diagram showing a SRAM device with memory sub-arrays. As shown in FIG. 3, in a SRAM device 300, a SRAM array is divided into multiple sub-arrays (e.g., SRAM sub-arrays 302 and 304). For example, each sub-array has a 4*144 configuration, i.e., 4 rows and 144 columns. Each row corresponds to a word line, and each column corresponds to one or more local bit lines. As an example, within the sub-array 302, one or more word lines 306 are arranged in a horizontal direction, and one or more local bit lines 308 are arranged in a vertical direction.

Global control (MCTL) circuits (e.g., the MCTL circuit 324) are configured to perform certain control functions, such as pre-decoding input signals (e.g., address signals, read/write signals, and/or clock signals) for accessing a target memory cell. Global input/output (GIO) circuits (e.g., the GIO circuit 322) are configured to read out data stored in a memory cell or receive data to be written to a memory cell. Each sub-array in the SRAM device 300 is associated with a local input/output (LIO) circuit, a local control (LCTL) circuit, and a word-line driver (WLD4). For example, the sub-array 302 is associated with a LIO circuit 310, a LCTL circuit 312 and a WLD4 320. The LIO circuit 310 and the WLD4 320 are configured to access one or more memory cells in the sub-array 302, e.g., based on the pre-decoded input signals. The WLD4 320 is configured to activate a particular word line, and the LIO circuit 310 is configured to activate one or more particular local bit lines so that one or more memory cells corresponding to the activated word line and the activated bit lines can be accessed to perform read/write operations. The LIO circuit 310 is further configured to communicate with the GIO circuit 322 through a global bit line (GBL) 314. The LCTL circuit 312 is configured to communicate with the MCTL circuit 324 through a global word-line-decoder (WDECC) line 316. For example, the LCTL circuit 312 receives the pre-decoded input signals from the MCTL circuit 324, determines information associated with a particular word line and/or one or more particular local bit lines to be activated, and provides the information to the LIO circuit 310 and the WLD4 320.

As shown in FIG. 3, dividing the SRAM array into multiple small sub-arrays often requires, for each sub-array, a LIO circuit and a LCTL circuit which occupy more areas on the chip. Furthermore, though dividing the SRAM array into multiple small sub-arrays results in shortened local bit lines, the global bit lines (GBL) and the global word-line-decoder (WDECC) lines are prolonged. For example, the global bit line 314 as shown in FIG. 3 needs to extend over not only three sub-arrays but also two LIO circuits, and the WDECC line 316 needs to extend over not only four sub-arrays but also two local control circuits. In contrast, neither the LIO circuits (e.g., the LIO circuit 310) nor the local control circuits (e.g., the local control circuit 312) are needed for an undivided SRAM array, and the undivided SRAM array would have a global bit line extending over three sub-arrays and a WDECC line extending over four sub-arrays. The benefits of shortened local bit lines in the SRAM device 300 with respect to increasing speed are reduced due to the prolonged global bit lines and the prolonged WDECC lines.

Figure 4:
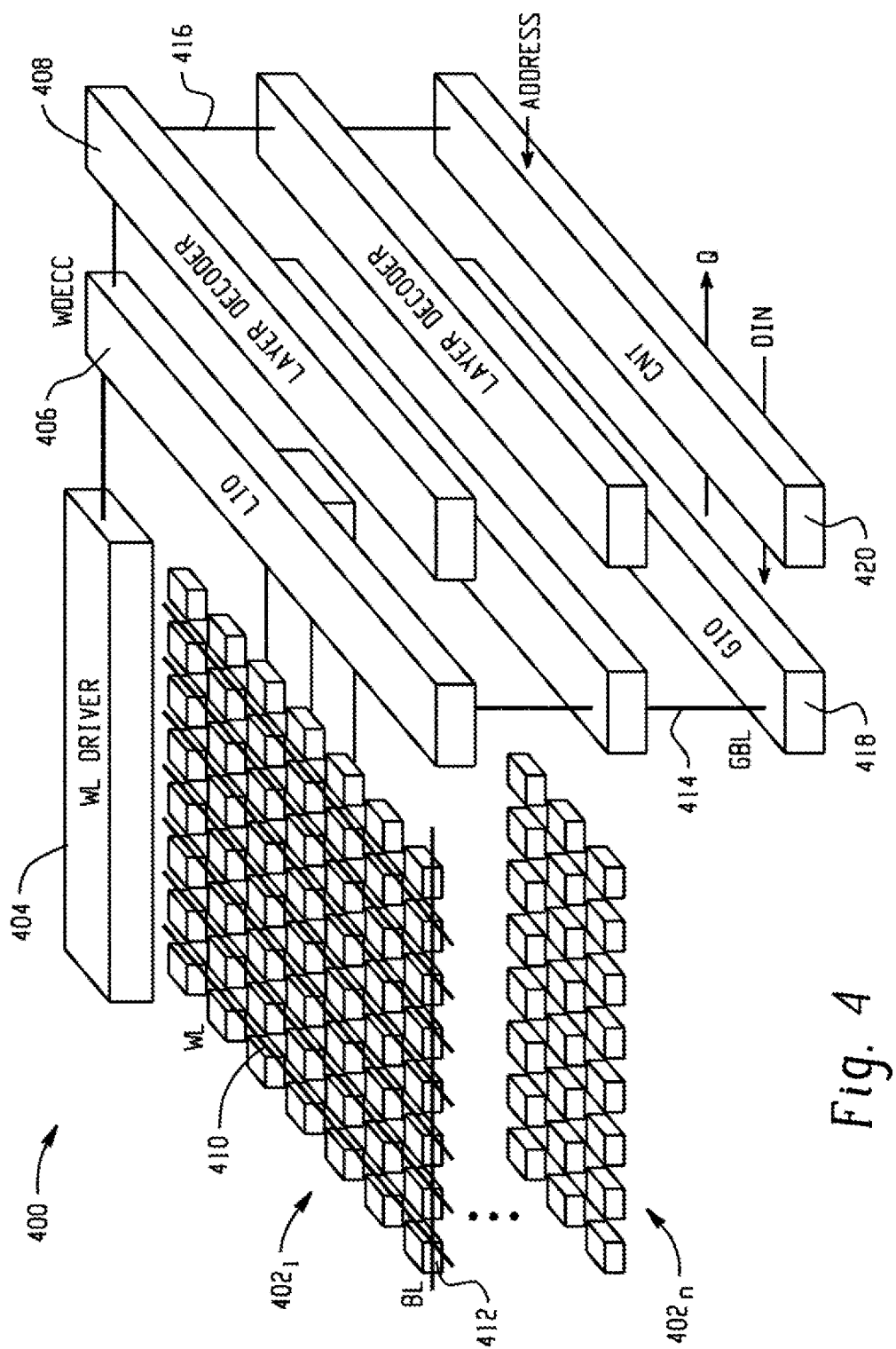
FIG. 4 depicts an example diagram showing a SRAM device fabricated in a multi-layer semiconductor device structure.

FIG. 4 depicts an example diagram showing a SRAM device fabricated in a multi-layer semiconductor device structure. As shown in FIG. 4, the SRAM device 400 includes multiple device layers (e.g., the layers $402_1$-$402_n$, where n is an integer larger than 1). Each device layer includes a number of SRAM cells arranged in columns and rows, a word-line (WL) driver, a LIO circuit, and a layer decoder. For example, the device layer $402_1$ includes a word-line (WL) driver 404, a LIO circuit 406, and a layer decoder 408. In addition, the device layer 402 includes one or more word lines 410 arranged along a first direction, and one or more local bit lines 412 arranged in a second direction that is perpendicular to the first direction.

One or more global bit lines (GBLs) 414 extend across all different device layers (e.g., the layers $402_1$-$402_n$) and connect with the LIO circuits (e.g., the LIO circuit 406) in the different device layers. In addition, one or more word-line-decoder (WDECC) lines 416 extend across all different device layers (e.g., the layers $402_1$-$402_n$) and connect with the WL drivers (e.g., the WL driver 404) in the different device layers. Furthermore, the SRAM device 400 includes a global control (CNT) circuit 420 configured to perform certain control functions and a global input/output (GIO) circuit 418 configured to read out data stored in a memory cell or receive data to be written to a memory cell.

In some embodiments, a particular device layer (e.g., one of the layers $402_1$-$402_n$) includes two groups of SRAM cells forming a butterfly structure. Specifically, the LIO circuit and the layer decoder of the particular device layer are located between the two groups of SRAM cells each arranged in columns and rows. For example, the two groups of SRAM cells have a same number of rows and a same number of columns. In certain embodiments, each of the device layers (e.g., the layers $402_1$-$402_n$) includes two groups of SRAM cells forming a butterfly structure. In some embodiments, the CNT circuit 420 and/or the GIO circuit 418 are located on top of or underneath the SRAM cells in a particular device layer (e.g., one of the layers $402_1$-$402_n$). In certain embodiments, the LIO circuit and/or the layer decoder of a particular device layer (e.g., any one of the layers $402_1$-$402_n$) are located on top of or underneath the SRAM cells in the same device layer.

Figure 5:
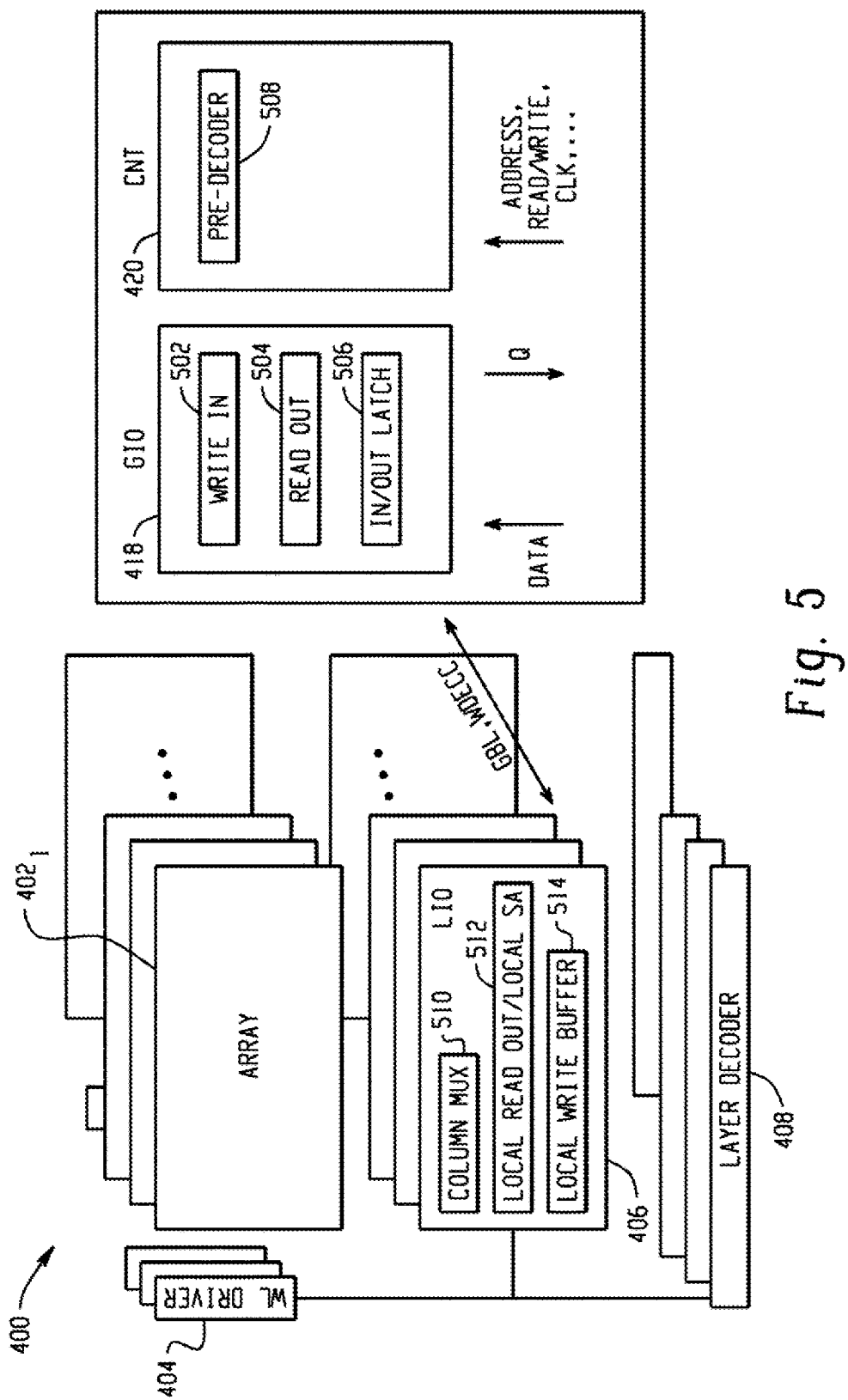
FIG. 5 depicts another example diagram showing the SRAM device as shown in FIG. 4.

FIG. 5 depicts another example diagram showing the SRAM device 400. As shown in FIG. 5, the GIO circuit 418 includes a write-in component 502 configured to receive data to be written to a target SRAM cell, a read-out component 504 configured to receive data read from a target SRAM cell, and an in/out latch 506 configured to temporarily store input or output data. The CNT circuit 420 includes a pre-decoder 508 configured to pre-decode certain input signals, such as address signals, read/write signals, and clock signals. After the input signals are pre-decoded, information associated with a target SRAM cell to be accessed for read/write operations is obtained, such as the device layer on which the target memory cell is located, and the row and the column corresponding to the target memory cell.

For example, based on the information obtained through pre-decoding the input signals, it is determined that the target SRAM cell is located on the device layer $402_1$. In response, the layer decoder 408 is used to activate the device layer $402_1$. Then, the WL driver 404 and the LIO circuit 406 are configured to activate a particular word line and one or more particular local bit lines for accessing the target SRAM cell. As shown in FIG. 5, the LIO circuit 406 includes a column multiplexer 510, a local-read-out/local-sense-amplifier component 512, and a local write buffer 514. The column multiplexer 510 is configured to select a particular column associated with the target SRAM cell. The local-read-out/local-sense-amplifier component 512 is configured to store data read from the target SRAM cell. In addition, the local write buffer 514 is configured to store data to be written to the target SRAM cell.

Referring to FIG. 4 and FIG. 5, through the GBL 414, the LIO circuit 406 sends data read from the target SRAM cell to the GIO circuit 418, or receives data to be written to the target SRAM cell from the GIO circuit 418. In some embodiments, data to be written to the target SRAM cell is transmitted to the LIO circuit 406 using an inter-layer structure other than the GBL 414. The layer decoder 408 communicates with the CNT circuit 420 through the WDECC line 416.

As an example, the SRAM cells in the SRAM device 400 include six-transistor SRAM cells (e.g., the SRAM cell 100), eight-transistor SRAM cells, or other types of SRAM cells. For example, more metal porosity is achieved since the global bit lines made of certain metal materials penetrate different layers in the SRAM device 400. In some embodiments, the GIO circuit 418 and the CNT circuit 420 are placed together in one of the device layers $402_1$-$402_n$. In certain embodiments, the GIO circuit 418 and the CNT circuit 420 are placed together in a separate device layer other than the device layers $402_1$-$402_n$. In other embodiments, the GIO circuit 418 and the CNT circuit 420 are placed in different device layers.

In some embodiments, the SRAM device 400 includes two device layers (e.g., n=2) and each device layer includes a SRAM array. The length of the GBL 414 and the length of the WDECC line 416 are comparable with a sum of the heights of the two device layers. In some embodiments, the global bit line 414 and the WDECC line 416 are much shorter than the global bit line 314 and the WDECC line 316 as shown in FIG. 3, respectively. For example, in each layer, an 1152-cell pitch is used along the first direction (i.e., the direction of the word line 410), and a 4-cell pitch is used along the second direction (i.e., the direction of the bit lines 412). The length of the word line 410 is approximately equal to the length of the 1152-cell pitch.

In certain embodiments, the SRAM device 400 includes eight device layers (e.g., n=8). The length of the global bit line 414 and the length of the WDECC line 416 are comparable with a sum of the heights of the eight device layers. In certain embodiments, the global bit line 414 and the WDECC line 416 are shorter than the global bit line 314 and the WLDV decoder 316 as shown in FIG. 3, respectively. For example, in each layer, a 288-cell pitch is used along the first direction (i.e., the direction of the word line 410), and a 4-cell pitch is used along the second direction (i.e., the direction of the bit line 412). Then, the length of the word line 410 is approximately equal to the length of the 288-cell pitch.

In certain embodiments, the GIO circuit 418 is located between any two of the device layers (e.g., the layers $402_1$-$402_n$). Specifically, the GIO circuit 418 is located between the LIO circuits of the two device layers, as an example. In some embodiments, the CNT circuit 420 is located between any two of the device layers (e.g., the layers $402_1$-$402_n$). Specifically, the CNT circuit 420 is located between the layer decoders of the two device layers, as an example.

Figure 6:
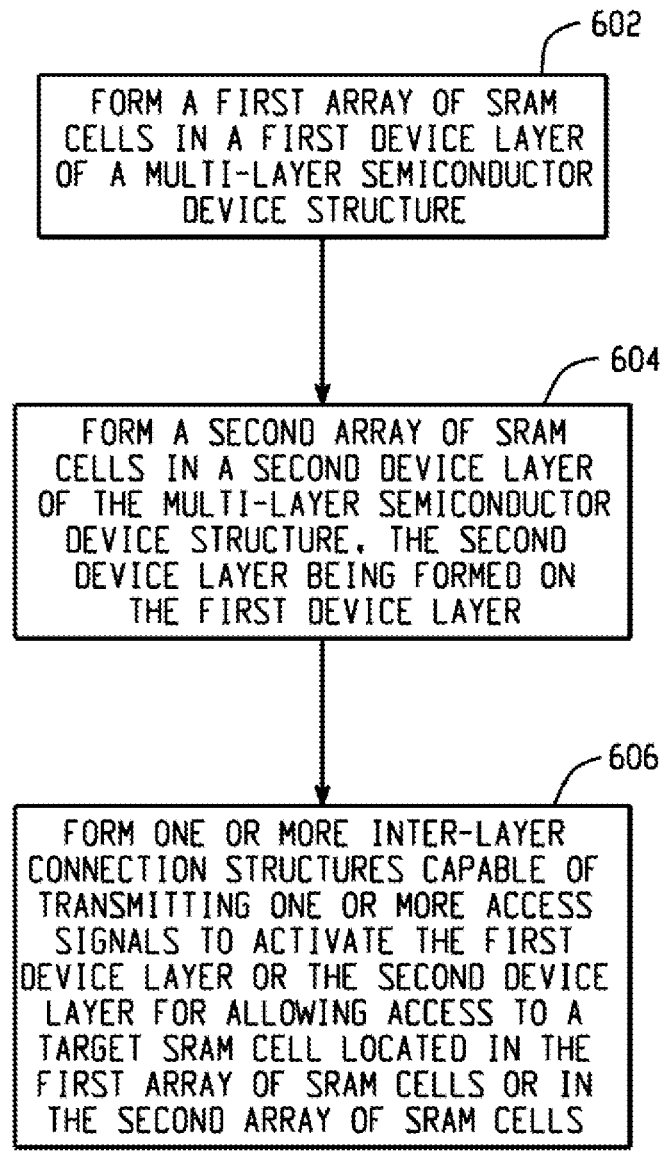
FIG. 6 depicts an example flow chart for fabricating a SRAM device in a multi-layer semiconductor device structure.

FIG. 6 depicts an example flow chart for fabricating a SRAM device in a multi-layer semiconductor device structure. At 602, a first array of SRAM cells are formed in a first device layer of a multi-layer semiconductor device structure. At 604, a second array of SRAM cells are formed in a second device layer of the multi-layer semiconductor device structure, the second device layer being formed on the first device layer. For example, the first array of SRAM cells and the second array of SRAM cells are arranged in columns and rows in the first device layer and the second device layer respectively. In each of the first device layer and the second device layer, one or more word lines are arranged along a first direction, and one or more local bit lines are arranged in a second direction that is perpendicular to the first direction.

At 606, one or more inter-layer connection structures are formed to transmit one or more access signals to activate the first device layer or the second device layer for allowing access to a target SRAM cell located in the first array of SRAM cells or in the second array of SRAM cells. For example, after certain input signals are pre-decoded, information associated with a target SRAM cell to be accessed for read/write operations is obtained, such as the device layer on which the target memory cell is located, and the row and the column corresponding to the target memory cell. If it is determined that the target SRAM cell is located on the first device layer, the first device layer is activated, and then a particular word line and one or more particular local bit lines in the first device layer are activated for accessing the target SRAM cell.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures. For example, certain transistors are described herein as examples, and the concepts, structures, layouts, materials, or operations may also be applicable to other types of semiconductor devices, such as bipolar junction transistors, diodes, capacitors, etc.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as "on," that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on and in immediate contact with the second layer/structure unless such is specifically stated; there may be one or more third layers/structures between the first layer/structure and the second layer/structure. The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A static random access memory (SRAM) device comprising:
   a plurality of device layers, each of the device layers comprising:
      an SRAM array;
      a word-line driver connected to rows of the SRAM array by word lines, the word lines extending in a first direction;
      a local input/output circuit connected to columns of the SRAM array by local bit lines, the local bit lines extending in a second direction, the second direction perpendicular to the first direction; and
      a layer decoder connected to the local input/output circuit and the word-line driver, the layer decoder configured to activate the local input/output circuit and the word-line driver in response to receiving an access signal;
   a global control circuit connected to the layer decoder of each of the device layers, the global control circuit configured to receive an input signal indicating a target SRAM cell, to determine which target layer of the device layers contains the target SRAM cell, and to transmit the access signal to the layer decoder of the target layer; and
   a global input/output circuit connected to the local input/output circuit of each of the device layers by global bit lines, the local bit lines being different from the global bit lines, the global input/output circuit configured to buffer data for the local input/output circuit of the target layer.

2. The SRAM device of claim 1, wherein the word-line driver of a first device layer of the plurality of device layers is configured to activate a single first word line associated with the SRAM array of the first device layer in response to being activated by the layer decoder of the first device layer.

3. The SRAM device of claim 2, wherein the local input/output circuit of the first device layer of the plurality of device layers is configured to activate one or more first local bit lines associated with the SRAM array of the first device layer in response to being activated by the layer decoder of the first device layer.

4. The SRAM device of claim 3, wherein the local input/output circuit of the first device layer of the plurality of device layers is configured to output data read from the SRAM array of the first device layer, and to store data to be written to the SRAM array of the first device layer.

5. The SRAM device of claim 1, wherein the global input/output circuit is configured to receive data from the local input/output circuit of each of the device layers, and to transmit data to the local input/output circuit of each of the device layers.

6. The SRAM device of claim 1, wherein the global input/output circuit is formed in a same layer as the global control circuit.

7. The SRAM device of claim 1, wherein the global input/output circuit is formed in a different layer than the global control circuit.

8. The SRAM device of claim 1, wherein the global input/output circuit and the global control circuit are each formed in one of the plurality of device layers.

9. The SRAM device of claim 1, wherein the global input/output circuit and the global control circuit are each positioned outside of the plurality of device layers.

10. A static random access memory (SRAM) device comprising:
   a first array of SRAM cells in a first device layer;
   a first word-line driver in the first device layer, the first word-line driver being coupled to the first array of SRAM cells by a plurality of first local word lines;
   a first local input/output circuit in the first device layer, wherein the first local input/output circuit is coupled to the first array of SRAM cells;
   a first layer decoder coupled to the first word-line driver and the first local input/output circuit, wherein the first layer decoder is configured to activate first word-line driver and the first local input/output circuit;
   a second array of SRAM cells in a second device layer;
   a second word-line driver in the second device layer, the second word-line driver being coupled to the second array of SRAM cells by a plurality of second local word lines;
   a second local input/output circuit in the second device layer, wherein the second local input/output circuit is coupled to the second array of SRAM cells;
   a second layer decoder coupled to the second word-line driver and the second local input/output circuit, wherein the second layer decoder is configured to activate second word-line driver and the second local input/output circuit;
   a global control circuit coupled to each of the first layer decoder and the second layer decoder, the global control circuit configured to receive an address signal and to transmit one or more access signals to activate the first device layer or the second device layer corresponding to the address signal; and
   a global input/output circuit coupled to the first local input/output circuit and the second local input/output circuit, the global input/output circuit configured to output data read from the first device layer and the second device layer.

11. The SRAM device of claim 10, wherein the global control circuit is positioned in a third device layer.

12. The SRAM device of claim 11, wherein the third device layer is below the first device layer and the second device layer.

13. The SRAM device of claim 10, wherein the global input/output circuit is coupled to the first local input/output circuit and the second local input/output circuit by global bit lines, wherein the first local input/output circuit is coupled to the first array of SRAM cells by first local bit lines, wherein the global bit lines are shorter than the first local bit lines.

14. The SRAM device of claim 10, wherein the first array of SRAM cells is positioned laterally above the second array of SRAM cells.

15. The SRAM device of claim 10, wherein the first array of SRAM cells comprises a first sub-array and a second sub-array.

16. The SRAM device of claim 10, wherein the first local input/output circuit temporarily stores data from the first array of SRAM cells, wherein the first local input/output circuit is configured to provide the data from the first array of SRAM cells to the global input/output circuit.

17. A static random access memory (SRAM) device, comprising:
   a first device layer, the first device layer comprising:
      a first SRAM array;
      a first word line driver coupled to the first SRAM array by a plurality of first word lines;
      a first input/output circuit coupled to the first SRAM array by plurality of first bit lines; and
      a first layer decoder configured to activate the first input/output circuit in response to a first access signal indicating that a target SRAM cell is located in the first SRAM array, wherein the first input/output circuit is configured to, in response to the activation thereof by the first layer decoder, activate the first word line driver;
   a second device layer, the second device layer comprising;
      a second SRAM array;
      a second word line driver coupled to the second SRAM array by a plurality of second word lines;
      a second input/output circuit coupled to the second SRAM array by plurality of second bit lines; and
      a second layer decoder configured to activate the second input/output circuit in response to a second access signal indicating that the target SRAM cell is located in the second SRAM array, wherein the second input/output circuit is configured to, in response to the activation thereof by the second layer decoder, activate the second word line driver; and
   a third device layer, wherein the first device layer, the second device layer, and the third device layer are vertically offset from each other, the third device layer comprising;
      a global input/output circuit configured to output data read from the target SRAM cell and to receive data to be written to the target SRAM cell; and
      a global control circuit coupled to each of the first layer decoder and the second layer decoder by one or more decoder lines, the global control circuit configured to receive an address signal and to activate a layer decoder corresponding to the address signal.

18. The SRAM device of claim 17, wherein the global input/output circuit is coupled to the first input/output circuit and the second input/output circuit by global bit lines.

19. The SRAM device of claim 17, wherein the first SRAM array comprises a first sub-array and a second sub-array.

20. The SRAM device of claim 17, wherein the third device layer is below the first device layer and the second device layer.

* * * * *